United States Patent
Lee et al.

(10) Patent No.: US 7,911,251 B2
(45) Date of Patent: Mar. 22, 2011

(54) CLOCK SIGNAL GENERATING CIRCUIT AND SEMICONDUCTOR MEMORY APPARATUS INCLUDING THE SAME

(75) Inventors: Hyeng Ouk Lee, Gyeonggi-do (KR); Kwan Weon Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 14 days.

(21) Appl. No.: 12/494,814

(22) Filed: Jun. 30, 2009

(65) Prior Publication Data

US 2010/0283519 A1    Nov. 11, 2010

(30) Foreign Application Priority Data

May 11, 2009   (KR) .................. 10-2009-0040841

(51) Int. Cl.
*G06F 1/04* (2006.01)
(52) U.S. Cl. ..................... 327/291; 327/63; 327/299
(58) Field of Classification Search ............. 327/63–65, 327/68–70, 291, 293–294, 298–299
See application file for complete search history.

(56) References Cited

U.S. PATENT DOCUMENTS

| | | | |
|---|---|---|---|
| 6,407,591 B1 * | 6/2002 | Wong et al. | 327/63 |
| 6,794,919 B1 * | 9/2004 | Volk et al. | 327/291 |
| 7,212,449 B2 | 5/2007 | Lee | |
| 7,449,927 B2 | 11/2008 | Kim | |
| 7,489,170 B2 | 2/2009 | Ku et al. | |
| 7,512,033 B2 | 3/2009 | Hur et al. | |
| 7,656,216 B1 * | 2/2010 | Reay | 327/298 |
| 2008/0273623 A1 * | 11/2008 | Chung et al. | 375/295 |
| 2009/0045857 A1 | 2/2009 | Kim | |

FOREIGN PATENT DOCUMENTS

| | | |
|---|---|---|
| JP | 2006-060842 A | 3/2006 |
| KR | 1020060046024 A | 5/2006 |

* cited by examiner

*Primary Examiner* — An T Luu
(74) *Attorney, Agent, or Firm* — Ladas & Parry LLP

(57) ABSTRACT

A clock signal generating circuit includes a main clock buffering unit and a sub clock buffering unit. The main clock buffering unit is capable of generating both a differential clock signal pair and a single clock signal. The main clock buffering unit selectively outputs either the differential clock signal pair or the single clock signal depending upon the frequency of an external clock signal. The sub clock buffering unit receives the output of the main clock buffering unit and generates first and second clock signals. The operation of the sub clock buffering unit depends upon whether the differential clock signal pair or the single clock signal is output by the main clock buffering unit.

15 Claims, 6 Drawing Sheets

CLOCK SIGNAL GENERATING CIRCUIT AND SEMICONDUCTOR MEMORY APPARATUS INCLUDING THE SAME

CROSS-REFERENCES TO RELATED PATENT APPLICATION

The present application claims priority under 35 U.S.C 119(a) to Korean Application No. 10-2009-0040841, filed on May 11, 2009, in the Korean Intellectual Property Office, which is incorporated herein by reference in its entirety as set forth in full.

BACKGROUND

1. Technical Field

Embodiments described herein relate generally to a semiconductor memory apparatus and, more particularly, to a clock signal generating circuit and a semiconductor memory apparatus including the same.

2. Background

A typical semiconductor memory apparatus is configured to receive an external clock signal and generate an internal clock signal having a phase locked through a delay locked loop circuit so that the internal clock signal operates in synchronization with the external clock signal. Further, the semiconductor memory apparatus generates a pair of clock signals having a 180 degree phase difference for high-speed operation and operates in synchronization with the phase difference.

FIG. 1 is a block diagram schematically showing a configuration of a conventional clock signal generating circuit. In FIG. 1, the clock signal generating circuit includes a delay locked loop circuit (hereinafter, referred to as 'DLL circuit') 10, a main clock buffer 20, and a sub clock buffer 30. The DLL circuit 10 generates first and second delay clock signals 'irclkdll' and 'ifclkdll' using a received external clock signal 'CLK'. The main clock buffer 20 generates first and second internal clock signals 'rclkdll' and 'fclkdll' by buffering the first and second delay clock signals 'irclkdll' and 'ifclkdll'. The first and second sub clock buffer 30 generates first and second clock signals 'rclk' and 'fclk' by buffering the first and second internal clock signals 'rclkdll' and 'fclkdll', respectively. The first and second clock signals 'rclk' and 'fclk' are transmitted to circuits that operate in synchronization with the clock signals.

As described above, the clock generating circuit includes buffers receiving and buffering clock signals. The buffering operation of the buffers allow a differential clock pair to be generated irrespective of frequency variations of the clock signals. In operation, the main clock buffer 10 is at all times operating in order to buffer the first and second delay clock signals 'irclkdll' and 'ifclkdll' and generate the first and second internal clock signals 'rclkdll' and 'fclkdll'. A consequence of the continuous operation of the main clock buffer is increased power consumption.

SUMMARY

Embodiment of the present invention include a clock signal generating circuit of a semiconductor memory apparatus that can generate a clock signal by a scheme that limits power consumption depending on a frequency of an external clock signal and a semiconductor memory apparatus.

In one embodiment, a clock signal generating circuit includes a main clock buffering unit configured to output a differential clock signal pair or a single clock signal from first and second delay clock signals depending on the frequency of an external clock signal; and a sub clock receiving the output of the main clock buffering unit and generating first and second clock signals. The manner in which the first and second clock signals is dependent upon whether the differential clock signal pair or the single clock signal has been output by the main clock buffering unit.

In another embodiment, a semiconductor memory apparatus includes a DLL circuit configured to receive an external clock signal in order to generate first and second delay clock signals; a frequency detector configured to generate a detection signal by detecting the frequency of the external clock signal; a main clock buffering unit receiving the first and second delay clock signals in order to generate an internal clock signal and providing the internal clock signal as either a differential clock signal pair or a single clock signal in response to the detection signal; and a sub clock buffering unit configured to generate first and second clock signals from the internal clock signal, which is provided as the differential clock signal pair or the single clock signal, in response to the detection signal.

In still another embodiment, a semiconductor memory apparatus includes a main clock buffering unit receiving first and second delay clock signals for generating an internal clock signal, and a first sub clock buffering unit configured to generate a first clock signal pair from the internal clock signal applied in the differential clock signal pair when the frequency of the external clock signal is in the first frequency range and generate the first clock signal pair from the internal clock signal applied in the single clock signal when the frequency of the external clock signal is in the second frequency range, and a second sub clock buffering unit configured to generate a second clock signal pair from the internal clock signal applied in the differential clock signal pair when the frequency of the external clock signal is in the first frequency range and generate the second clock signal pair from the internal clock signal applied in the single clock signal when the frequency of the external clock signal is in the second frequency range.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
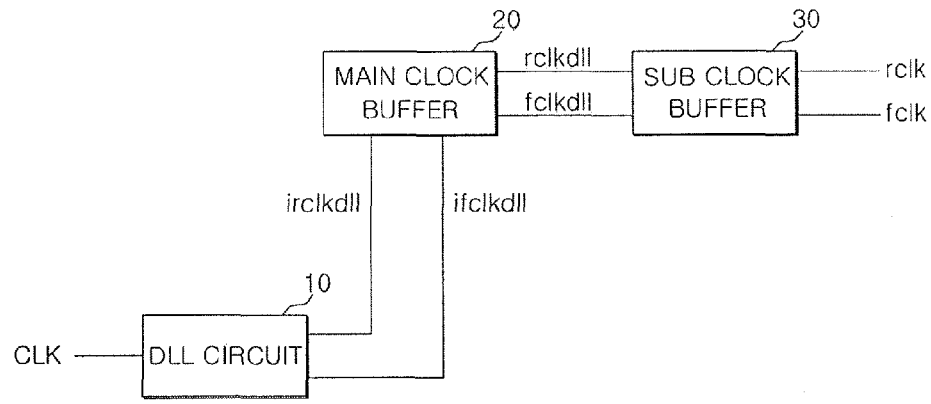
FIG. 1 is a block diagram schematically showing a configuration of a conventional clock signal generating circuit.
Figure 2:
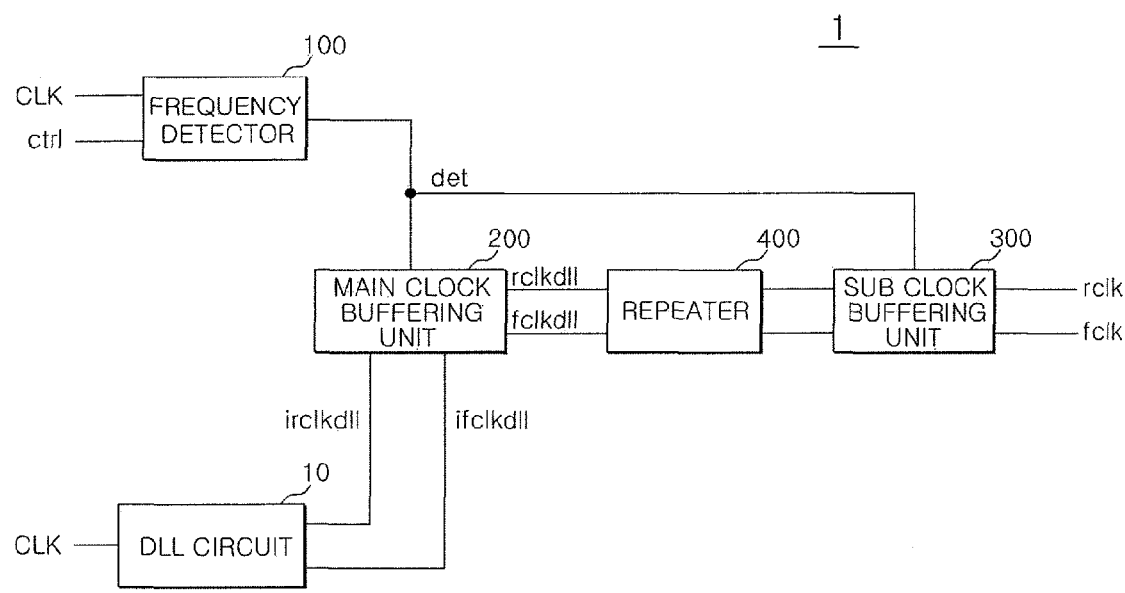
FIG. 2 is a schematic block diagram showing an exemplary clock signal generating circuit according to an embodiment of the present invention.

FIG. 2 is a schematic diagram of an exemplary clock signal generating circuit according to an embodiment of the present invention. In FIG. 2, the clock signal generating circuit 1 is configured to include a frequency detector 100, a main clock buffering unit 200, and a sub clock buffering unit 300. The frequency detector 100 detects the frequency of an external clock signal 'CLK' and generates a detection signal 'det' according to the frequency. For example, the frequency detector 100 will enable the detection signal 'det' when the frequency of the external clock signal 'CLK' is in a first frequency range and will disable the detection signal 'det' when the frequency of the external clock signal 'CLK' is in a second frequency range. Thus, the detection signal 'det' is enabled according to the frequency level of the external clock signal 'clk'. In an embodiment, the first frequency range is a high-frequency range and the second frequency range is a low-frequency range having a frequency range that is lower than that of the first frequency range. In the embodiment shown in FIG. 2, the frequency detector 100 is configured to detect the frequency of the external clock signal 'CLK' in response to a control signal 'ctrl'. The control signal 'ctrl' will be described below.

The main clock buffering unit 200 generates first and second delay clock signals 'irclkdll' and 'ifclkdll'. The first and second delay clock signals 'irclkdll' and 'ifclkdll' are generated by a delay locked loop (DLL) circuit 10 so as to be delay-locked, thereby allowing the semiconductor memory apparatus to operate in synchronization with the external clock signal 'CLK'. The first and second delay clock signals 'irclkdll' and 'ifclkdll' are a differential clock signal pair having a phase difference of 180 degrees. The main clock buffering unit 200 is configured so that it is capable of providing both the differential clock pair and the single clock signal as the internal clock signal. The main clock buffering unit is configured to selectively provide either the differential clock pair or the single clock signal according to the frequency of the external clock signal. More specifically, when the frequency of the external clock signal 'CLK' is a high frequency failing within the first frequency range, the main clock buffering unit 200 provides the different clock signal pair as the internal clock signal; and when the frequency of the external clock signal 'CLK' has a low frequency that falls within the second frequency range, the main clock buffering unit 200 provides the single clock as the internal clock signal. In further detail, in an embodiment of the present invention, the main clock buffering unit 200 provides first and second internal clock signals 'rclkdll' and 'fclkdll' as the internal clock signal by buffering the first and second delay clock signals 'irclkdll' and 'ifclkdll' when the detection signal 'det' is enabled indicating a high frequency; and the main clock buffering unit 200 provides the first internal clock signal 'rclkdll' as the internal clock signal by buffering the first delay clock signal 'irclkdll' when the detection signal 'det' is not enabled indicating a low frequency.

In the embodiment of the present invention shown in FIG. 2, the sub clock buffering unit 300 is configured to receive the internal clock signal from the main clock buffering unit 200 in order to generate the first and second clock signal 'rclk' and 'fclk'. In an embodiment, the sub clock buffering unit 300 is responsive to the detection signal 'det' in order to generate the first and second clock signals 'rclk' and 'fclk' from the first and second internal clock signals 'rclkdll' and 'fclkdll', which are provided when the different clock signal pair is generated, or the first internal clock signal 'rclkdll', which is provided when the single clock signal is generated. More specifically, when the frequency of the external clock signal 'CLK' is a high frequency that falls within the range of the first frequency range, the sub clock buffering unit 300 generates the first and second clock signal 'rclk' and 'fclk' by buffering the first and second internal clock signals 'rclkdll' and 'fclkdll' provided as the different clock pair; and when the frequency of the external clock signal 'CLK' is a low frequency falling within the second frequency range, the sub clock buffering unit 300 generates the first and second clock signals 'rclk' and 'fclk' by buffering the first internal clock signal 'rclkdll' provided as the single clock signal.

Referring to FIG. 2, in an embodiment, the clock signal generating circuit 1 can be configured to further include a repeater 400 that buffers the first and second internal clock signals 'rclkdll' and 'fclkdll' generated by the main clock buffering unit 200. The repeater 400 is generally constituted by an inverter chain to buffer the respective first and second internal clock signals 'rclkdll' and 'fclkdll'.

Figure 3:
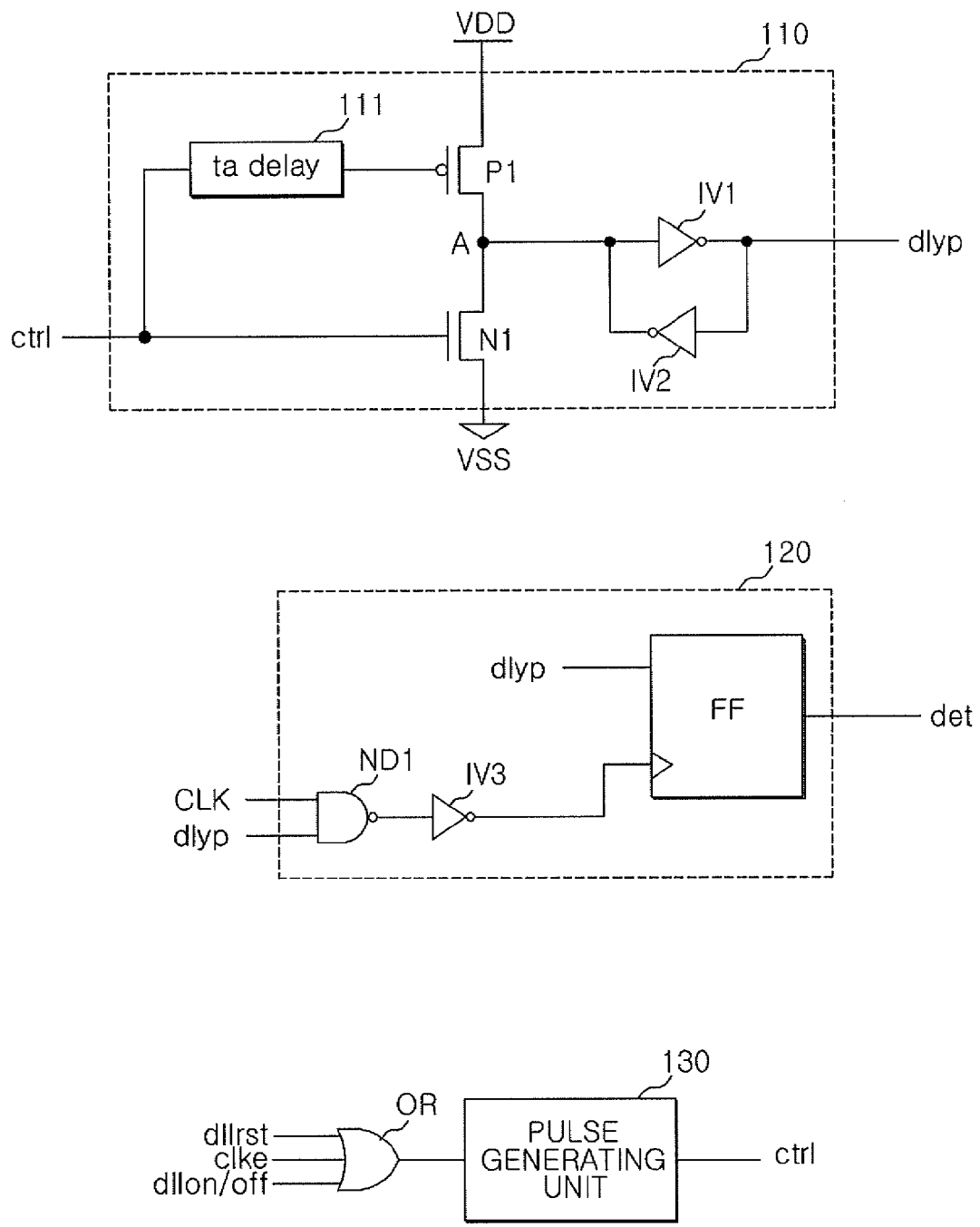
FIG. 3 is a schematic diagram showing an exemplary frequency detector of FIG. 2 according to an embodiment of the present invention.

FIG. 3 is a schematic diagram of an exemplary frequency detector of the clock signal generating circuit of 1 according to an embodiment of the present invention. In the embodiment shown in FIG. 3, the frequency detector 100 includes a detection pulse generating unit 110 and a detection signal generating unit 120. In an embodiment, the detection pulse generating unit 110 generates the detection pulse signal 'dlyp' to have a predetermined pulse width 'ta' in response to the control signal 'ctrl'. The predetermined pulse width 'ta' of the detection pulse signal 'dlyp' can be arbitrarily adjusted depending on application. The control signal 'ctrl' can be generated by a DLL reset signal 'dllrst' or a clock enable signal 'clke' generated from a mode resister set of the semiconductor memory apparatus. Further, the control signal 'ctrl' may be generated by a DLL on/off signal 'dllon/off'. The DLL reset signal 'dllrst' is provided after a predetermined time in the mode resister set after the semiconductor memory apparatus is powered up. The clock signal enable signal 'clke' distinguishes an active mode from a power down mode of the semiconductor memory apparatus. The DLL on/off signal 'dllon/off', which indicates DLL operation on/off of the semiconductor memory apparatus, can be applied from the outside. The control signal 'ctrl' can be generated through an OR gate that receives the DLL reset signal 'dllrst', the clock signal enable signal 'clke', and the DLL on/off signal 'dllon/off' and a pulse generator 130 that receives the output of the OR gate.

The reason for using the DLL reset signal 'dllrst' to generate the control signal 'ctrl' is to detect the frequency of the external clock signal 'CLK' at the time when the clock signal generating circuit 1 operates after the semiconductor memory apparatus is powered up. The reason for using the clock signal enable signal 'clke' to generate the control signal 'ctrl' is that the main clock buffering unit 200 provides the single clock signal as the internal clock signal by disabling the detection signal 'det' to reduce power consumption in the power down mode, and that the main clock buffering unit 200 selectively provides the differential clock signal pair or the single clock signal as the internal clock signal depending on the frequency of the external clock signal 'CLK' to accurately and stably generate the clock signal while reducing the power consumption in the active mode. Further, the reason for using the DLL on/off signal 'dllon/off' to generate the control signal 'ctrl' is that the main clock buffering unit 200 provides the single clock signal as the internal clock signal to reduce the power consumption when the semiconductor memory apparatus does not perform the DLL operation, and that the main clock buffering unit 200 selectively provides the differential clock signal pair or the single clock signal as the internal clock signal depending on the frequency of the external clock signal 'CLK' when the semiconductor memory apparatus performs the DLL operation. Signals for generating the control signal 'ctrl' are not limited to the example and may include control signals in regard to all operations of the semiconductor memory apparatus, which are related to a frequency of a clock signal.

In an embodiment, the detection signal generating unit 120 receives the detection pulse signal 'dlyp' and the external clock signal 'CLK' for generating the detection signal 'det'. The detection signal generating unit 120 is configured to detect whether or not the rising edge of the external clock signal 'CLK' is generated during an interval when the detection pulse signal 'dlyp' is enabled and enables the detection signal 'det' when the rising edge of the external clock signal 'CLK' is generated and disables the detection signal 'det' when the rising edge of the external clock signal is not generated.

Referring to the detection pulse generating unit 110 shown in FIG. 3, in an embodiment the detection pulse generating unit 110 includes a delay portion 111, a PMOS transistor P1, an NMOS transistor N1, and first and second inverters IV1 and IV2. The delay portion 111 delays the control signal 'ctrl' so as to create the predetermined pulse width 'ta' of the detection pulse signal 'dlyp', that is, an enable interval of the detection pulse signal 'dlyp'. The PMOS transistor P1 is responsive to the output of the delay portion 111 and when turned on applies an external voltage VDD to a common node A. The NMOS transistor N1 is responsive to the control signal 'ctrl' and when turned on applies a ground voltage VSS to the common node A. The first and second inverters IV1 and IV2 constitute a latch in which input terminals of the respective inverters IV1 and IV2 are connected to output terminals of the respective inverters IV1 and IV2, so as to generate the detection pulse signal 'dlyp' whose voltage level depends on the voltage level of the common node A. Accordingly, the detection pulse generating unit 110 can generate a detection pulse signal 'dlyp' having a predetermined pulse width 'ta' as much as the delay amount of the delay portion 111 when the control signal 'ctrl' is applied as a pulse.

Referring to the detection signal generating unit 120 shown in FIG. 3, in an embodiment the detection signal generating unit 120 includes a first NAND gate ND1, a third inverter IV3, and a flip-flop FF. The first NAND gate ND1 receives the detection pulse signal 'dlyp' and the external clock signal 'CLK'. The third inverter IV3 inverts the output of the first NAND gate ND1. The output of the third inverter IV3 is applied to a clock signal terminal of the flip-flop FF, and the detection pulse signal 'dlyp' is applied to the data terminal of the flip-flop. The flip-flop FF outputs the detection signal 'det' by latching the detection pulse signal 'dlyp' inputted into the data terminal at the time when the rising edge of the output of the third inverter IV3 inputted into the clock signal terminal is generated. Accordingly, the detection signal generating unit 120 is configured to enable the detection signal 'det' when the rising edge of the external clock signal 'CLK' is generated and disable the detection signal 'det' when the rising edge of the external clock signal 'CLK' is not generated during the interval in which the detection pulse signal 'dlyp' is enabled.

Figure 4:
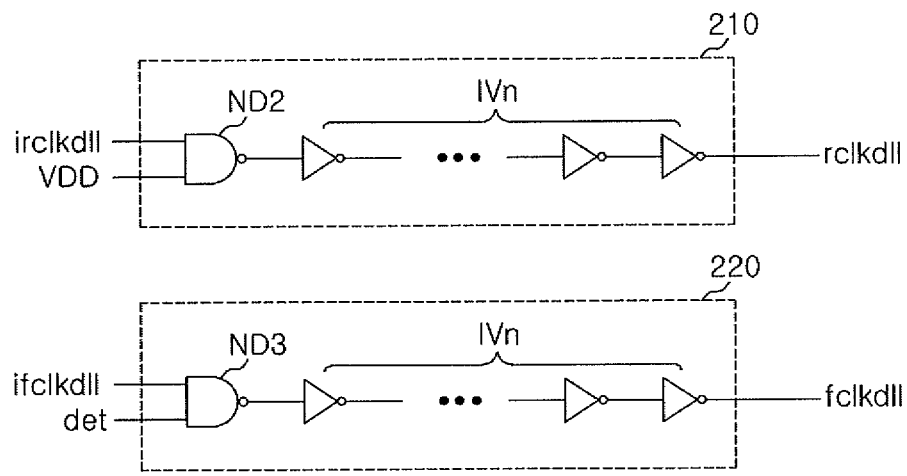
FIG. 4 is a schematic diagram showing an exemplary main clock buffering unit of the frequency detector of FIG. 2 according to an embodiment of the present invention.

FIG. 4 is a schematic diagram of an exemplary main clock buffering unit of the clock signal generating circuit shown in FIG. 2 according to an embodiment of the present invention. In FIG. 4, the main clock buffering unit 200 includes first and second internal clock signal generating units 210 and 220. The first internal clock signal generating unit 210 receives the first delay clock signal 'irclkdll' and the external voltage VDD in order to generate the first internal clock signal 'rclkdll'. In an embodiment, the first internal clock signal generating unit 210 is configured to include a second NAND gate ND2 and a plurality of inverters IVn. The first delay clock signal 'irclkdll' and the external voltage VDD are applied to the second NAND gate ND2. The plurality of inverters IVn are sequentially connected to each other in series and generate the first internal clock signal 'rclkdll' by sequentially inverting the output of the second NAND gate ND2. Since the second NAND gate ND2 is applied with the external voltage VDD as one input, the first internal clock signal generating unit 210 generates the first internal clock signal 'rclkdll' from the first delay clock signal 'irclkdll' at all times irrespective of the frequency of the external clock signal 'CLK'.

The second internal clock signal generating unit 220 receives the second delay clock signal 'ifclkdll' and the detection signal 'det' in order to generate the second internal clock signal 'fclkdll'. In an embodiment, the second internal clock signal generating unit 220 includes a third NAND gate and a plurality of inverters IVn. The second delay clock signal 'ifclkdll' and the detection signal 'det' are applied to the second NAND gate ND2. The plurality of inverters IVn are sequentially connected to each other in series and generate the second internal clock signal 'fclkdll' by sequentially inverting the output of the third NAND gate ND3. In an embodiment, the number of inverters IVn of the second internal clock signal generating unit 220 is the same as the number of inverters IVn of the first internal clock signal generating unit 210. Since the third NAND gate ND3 is applied with the detection signal 'det', the second internal clock signal generating unit 220 generates the second internal clock signal 'fclkdll' from the second delay clock signal 'ifclkdll' when the detection signal 'det' is enabled and does not generate the second internal clock signal 'fclkdll' when the detection signal 'det' is disabled.

Figure 5:
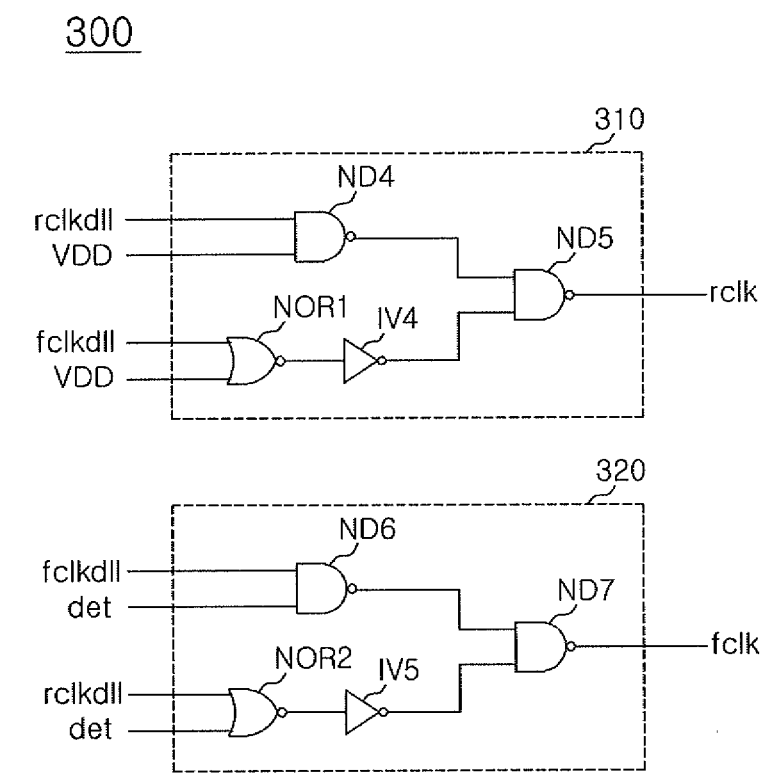
FIG. 5 is a schematic diagram of an exemplary sub clock buffering unit of the frequency detector of FIG. 2 according to an embodiment of the present invention.

FIG. 5 is a schematic diagram of an exemplary sub clock buffering unit of the clock signal generating circuit shown in FIG. 2 according to an embodiment of the present invention. In FIG. 5, the sub clock buffering unit 300 includes a first clock signal generating unit 310 and a second clock signal generating unit 320. The first clock signal generating unit 310 receives the first and second internal clock signals 'rclkdll' and 'fclkdll' and the external voltage VDD in order to generate the first clock signal 'rclk'. In an embodiment, the first clock signal generating unit 310 includes a fourth NAND gate ND4, a first NOR gate NOR1, a fourth inverter IV4, and a fifth NAND gate ND5. the first internal clock signal 'rclkdll' and the external voltage VDD are applied to the fourth NAND gate ND4. The second internal clock signal 'fclkdll' and the external voltage VDD are applied to the first NOR gate NOR1, and the fourth inverter IV4 inverts the output of the first NOR gate NOR1. The fifth NAND gate ND5 receives the output of the fourth NAND gate ND4 and the output of the fourth inverter IV4 in order to generate the first clock signal 'rclk'. As such, the first clock signal generating unit 310 generates the first clock signal 'rclk' from the first internal clock signal 'rclkdll' at all times irrespective of the frequency of the external clock signal 'CLK'. Since the first clock signal generating unit 310 generates the first clock signal 'rclk' from the first internal clock signal 'rclkdll' at all times, the first clock signal generating unit 310 may be configured by an embodiment having simpler logic. In the embodiment shown in FIG. 5, the logic of the first clock signal generating unit 310 has the same configuration as the logic of the second clock signal generating unit 320 in order to correspond to the loading operation of the second clock signal generating unit 320 to be described below.

The second clock signal generating unit 320 receives the first and second internal clock signals 'rclkdll' and 'fclkdll' and the detection signal 'det' in order to generate the second clock signal 'fclk'. In an embodiment, the second clock signal generating unit 320 includes a sixth NAND gate ND6, a second NOR gate NOR2, a fifth inverter IV5, and a seventh NAND gate ND7. The second internal clock signal 'fclkdll' and the detection signal 'det' are applied to the sixth NAND gate ND6. The first internal clock signal 'rclkdll' and the detection signal 'det' are applied to the second NOR gate NOR2, and the fifth inverter IV5 inverts the output of the second NOR gate NOR2. The seventh NAND gate ND7 receives the output of the sixth NAND gate ND6 and the output of the fifth inverter IV5 in order to generate the second clock signal 'fclk'. Accordingly, the second clock signal generating unit 320 generates the second clock signal 'fclk' from the second internal clock signal 'fclkdll' when the detection signal 'det' is enabled and generates the second clock signal 'fclk' from the first internal clock signal 'rclkdll' when the detection signal 'det' is disabled.

Figure 6:
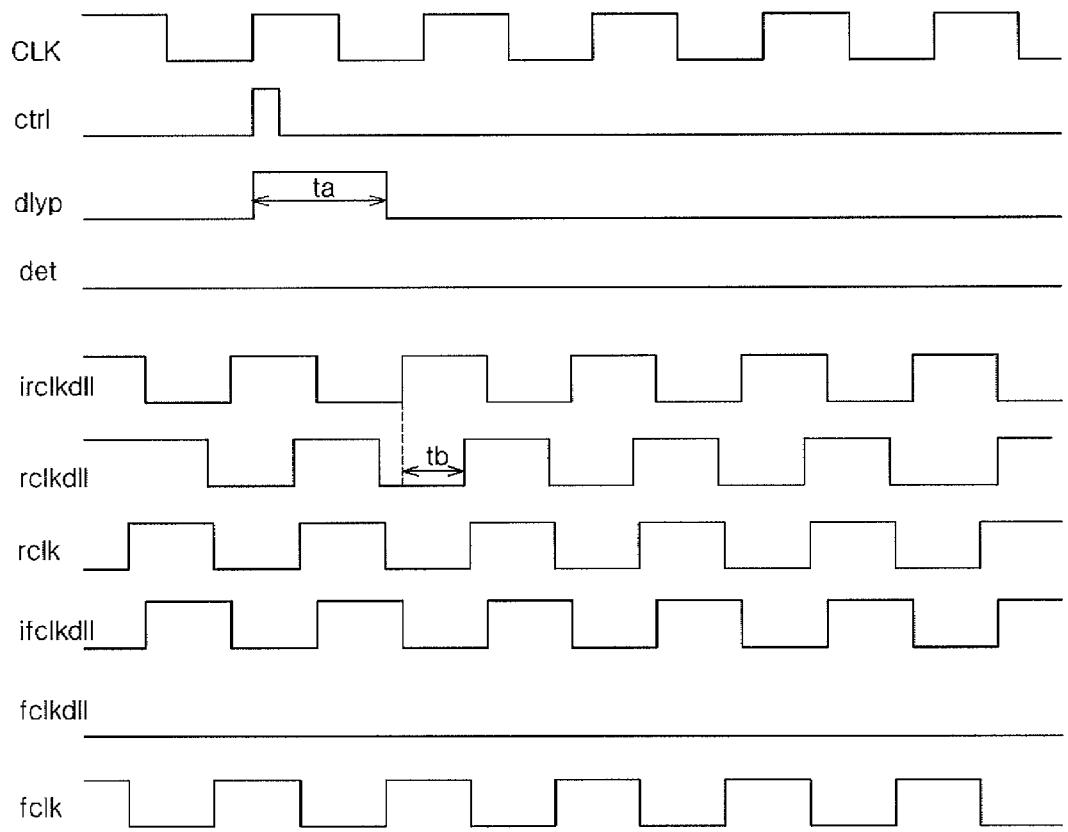
FIG. 6 is a timing diagram shown for illustrating the operation of a clock signal generating circuit when an external clock signal has a low frequency according to an embodiment of the present invention.
Figure 7:
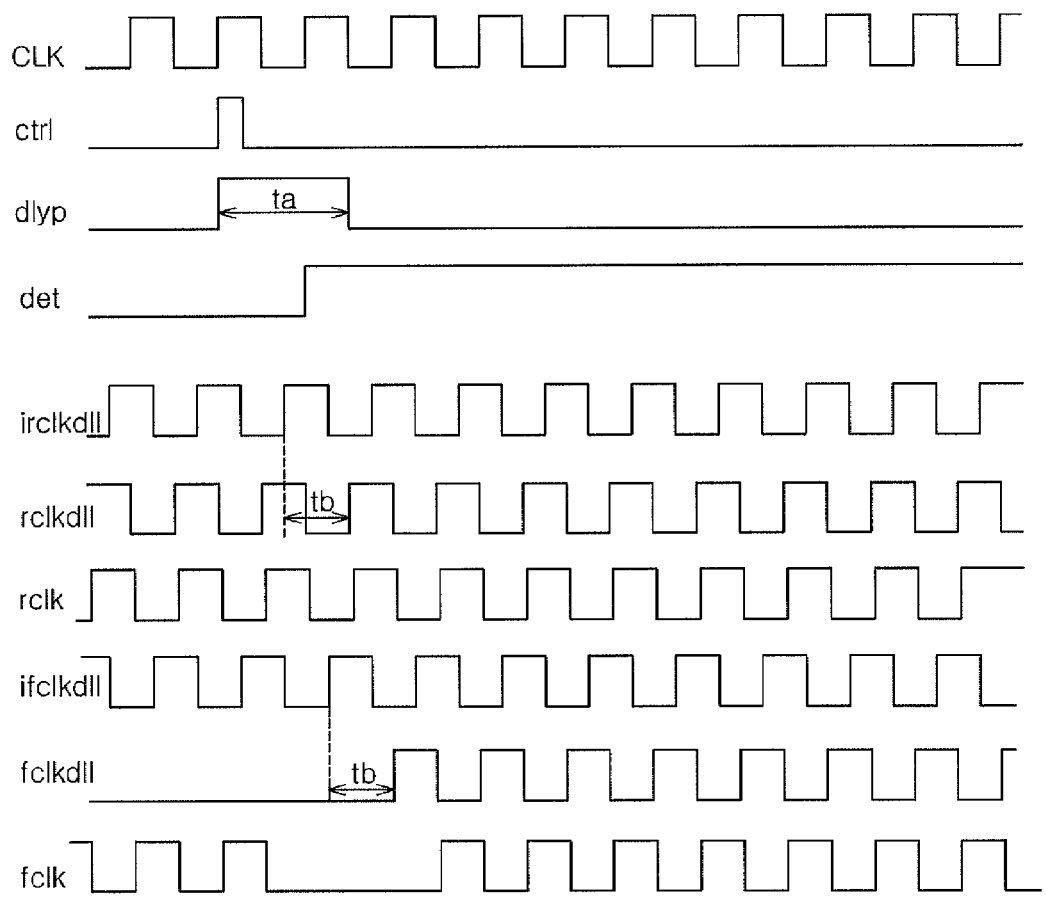
FIG. 7 is a timing diagram shown for illustrating the operation of a clock signal generating circuit when an external clock signal has a high frequency according to an embodiment of the present invention.

FIG. 6 is a timing diagram shown for illustrating the operation of a clock signal generating circuit when an external clock signal has a low frequency according to an embodiment; and FIG. 7 is a timing diagram shown for illustrating the operation of a clock signal generating circuit when an external clock signal has a high frequency according to an embodiment. Referring to FIGS. 2 to 7, the operation of the clock signal generating circuit 1 will be described below. When the semiconductor memory apparatus is powered up such that the DLL reset signal 'dllrst' is enabled, or when the semiconductor memory apparatus is switched from the power down mode to the active mode such that the clock signal enable signal 'clke' is enabled, the control signal 'ctrl' is enabled. The detection pulse generating unit 110 of the frequency detector 100 generates a detection pulse signal 'dlyp' having a predetermined pulse width 'ta' in response to the control signal 'ctrl', and the detection signal generating unit 120 of the frequency detector receives the detection pulse signal 'dlyp' and the external clock signal 'CLK'. Since the rising edge of the external clock signal 'CLK' having the low frequency is not generated during the interval when the detection pulse signal 'dlyp' is enabled, the detection signal 'det' is disabled. The main clock buffering unit 200 generates the first internal clock signal 'rclkdll' from the first delay clock signal 'irclkdll' of the first and second delay clock signals 'irclkdll' and 'ifclkdll' transmitted from the DLL circuit 10 in response to the disabled detection signal 'det'. In FIG. 6, a delay time 'tb' by the main clock buffering unit 200 is shown. The delay time 'tb' can be determined by the number of inverters that are included in the main clock buffering unit 200. The number of inverters may be changed in order to match the application and synchronization timing of the semiconductor memory apparatus.

At this time, the second internal clock signal 'fclkdll' is not generated due to the disabled detection signal 'det'; and therefore, the main clock buffering unit 200 provides the first internal clock signal 'rclkdll' as the single clock signal. In an embodiment, the repeater 400 can then buffer and transmit the first internal clock signal 'rclkdll' to the sub clock buffering unit 300. The sub clock buffering unit 300 receives the first internal clock signal 'rclkdll'. The first clock signal generating unit 310 of the sub clock buffering unit 300 generates the first clock signal 'rclk' from the first internal clock signal 'rclkdll', and the second clock signal generating unit 320 generates the second clock signal 'fclk' also from the first internal clock signal 'rclkdll' due to the disabled detection signal 'det'. The first and second clock signals 'rclk' and 'fclk' are transferred to circuits of the semiconductor memory apparatus, which operate in synchronization with the clock signal.

Referring to FIG. 7, when the external clock signal 'CLK' has a high frequency, a rising edge of the external clock signal 'CLK' is generated while the detection pulse signal 'dlyp' is enabled, such that the detection signal 'det' is enabled. The first internal clock signal generating unit 210 of the main clock buffering unit 200 generates the first internal clock signal 'rclkdll' from the first delay clock signal 'irclkdll', and the second internal clock signal generating unit 220 generates the second internal clock signal 'fclkdll' from the second delay clock signal 'ifclkdll' in response to the enabled detection signal 'det'. Accordingly, when the detection signal 'det' is enabled, the main clock buffering unit 200 generates and provides the first and second internal clock signals 'rclkdll' and fclkdll' as the differential clock signal pair. The first clock signal generating unit 310 of the sub clock buffering unit 300 generates the first clock signal 'rclk' from the first internal clock signal 'rclkdll', and the second clock signal generating unit 320 generates the second clock signal 'fclk' from the second internal clock signal 'fclkdll' in response to the is enabled detection signal 'det'.

Accordingly, when the external clock signal 'CLK' has the low frequency, the main clock buffering unit generates the clock signal by providing the single clock signal as the internal clock signal, thereby reducing the power consumption of the main clock buffering unit and the repeater. Further, when the external clock signal has the high frequency, the main clock buffering unit provides the differential clock pair as the internal clock signal, thereby generating a stable and accurate clock signal even at high frequencies.

Figure 8:
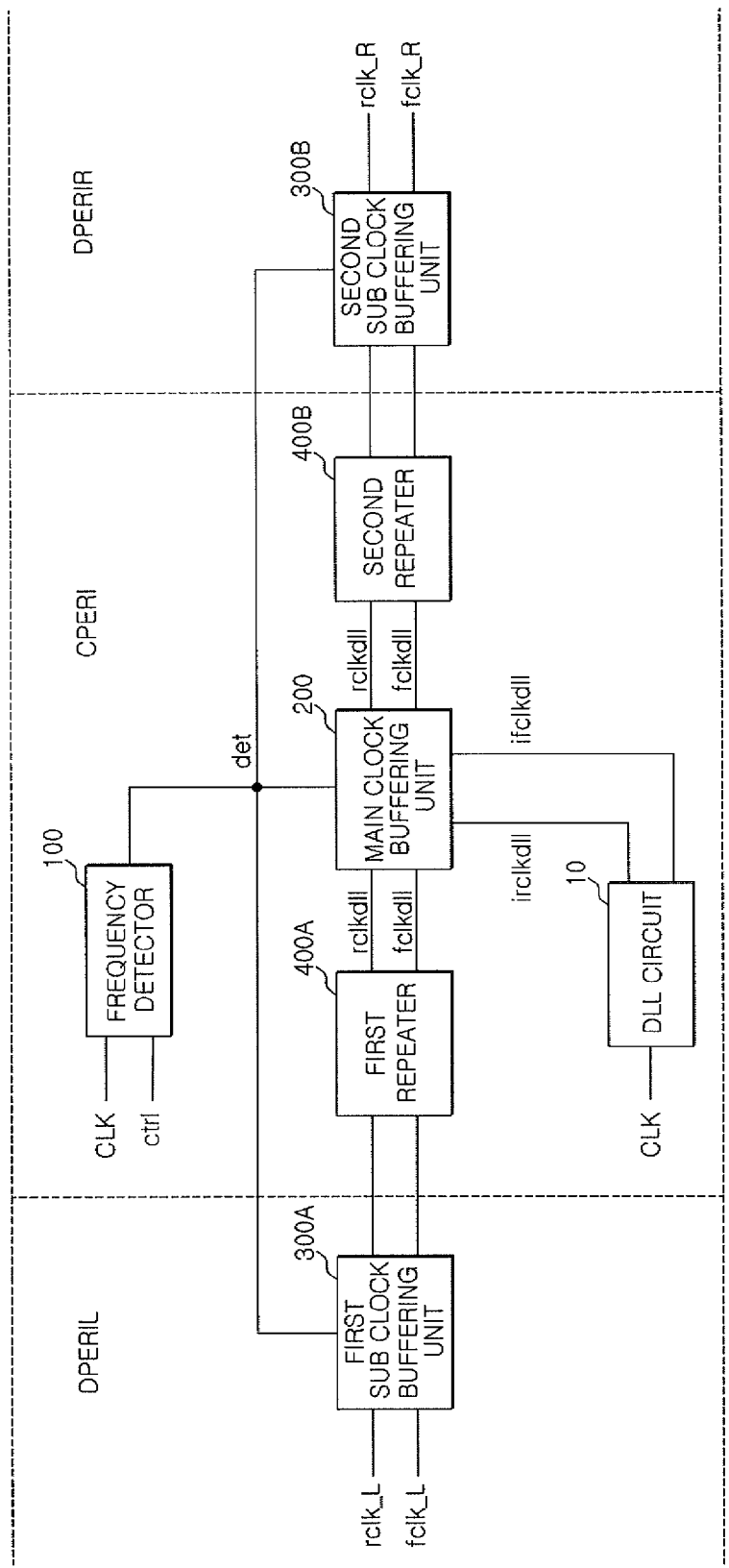
FIG. 8 is a schematic diagram showing an exemplary semiconductor memory apparatus according to an embodiment of the present invention.

FIG. 8 is a schematic diagram of an exemplary semiconductor memory apparatus according to an embodiment of the present invention. In FIG. 8, a semiconductor memory apparatus can includes a frequency detector 100, a main clock buffering unit 200, and first and second sub clock buffering units 300A and 300B. In an embodiment, the frequency detector 100 and the main clock buffering unit 200 have the same configuration as the circuits shown in FIGS. 3 and 4, and the first and second sub clock buffering units 300A and 300B have the same configuration as the circuit shown in FIG. 5. Referring to FIG. 8, the main clock buffering unit 200 is positioned in a center peripheral circuit region CRERI; the first sub clock buffering unit 300A is positioned in a left peripheral circuit region DPERIL; and the second sub clock buffering unit 300B is positioned in a right peripheral circuit region DPERIR. In an embodiment, the sub clock buffering unit 300A receives the first and second internal clock signals 'rclkdll' and 'fclkdll', which are generated by the main clock buffering unit 200, in order to generate a pair of first clock signals 'rclk_L' and 'fclk_L'. Further, the second sub clock buffering unit 300B also receives the first and second internal clock signals 'rclkdll' and 'fclkdll' in order that the second sub clock buffering unit 300B can generate a pair of second clock signals 'rclk_R' and 'fclk_R'. The first sub clock buffering unit 300A, which is positioned at the left side of the center peripheral circuit region, transmits the pair of first clock signals 'rclk_L' and 'fclk_L' to circuits that operate in synchronization with a clock signal, and the second sub clock buffering unit 300B, which is positioned at the right side of the center peripheral circuit region, transmits the pair of second clock signals 'rclk_R' and 'fclk_R' to the circuits that operate in synchronization with the clock signal.

In an embodiment, the semiconductor memory apparatus can further include a first repeater 400A that buffers and provides the first and second internal clock signals 'rclkdll' and 'fclkdll' to the first sub clock buffering unit 300A and a second repeater 400B that buffers and provides the first and second internal clock signals 'rclkdll' and 'fclkdll' to the second sub clock buffering unit 300B.

While certain embodiments have been described above, it will be understood to those skilled in the art that the embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A clock signal generating circuit, comprising:
   a main clock buffering unit configured so as to be capable of generating a differential clock signal pair and a single clock signal from first and second delay clock signals, wherein the main clock buffering unit is configured to selectively output the differential clock signal pair or the single clock signal depending on the frequency of an external clock signal; and
   a sub clock buffering unit configured to receive the output of the main clock buffering unit in order to generate first and second clock signals.

2. The clock signal generating circuit of claim 1, wherein the main clock buffering unit is configured to:
   generate the differential clock signal pair from the first and second delay clock signals to transmit the differential clock signal pair to the sub clock buffering unit when the frequency of the external clock signal is in a first frequency range, and
   generate the single clock signal from the first and second delay clock signals to transmit the single clock signal to the sub clock buffering unit when the frequency of the external clock signal is in a second frequency range.

3. The clock signal generating circuit of claim 2, wherein:
   the sub clock buffering unit receives the differential clock signal pair when the frequency of the external clock signal is in the first frequency to generate the first and second clock signals, and
   the sub clock buffering unit receives the single clock signal when the frequency of the external clock signal is in the second frequency to generate the first and second clock signals.

4. The clock signal generating circuit of claim 3, wherein the first frequency range is a high-frequency range having a higher frequency than the second frequency range.

5. The clock signal generating circuit of claim 3, wherein the sub clock buffering unit is configured to:
   generate the first and second clock signals from the differential clock signal pair when the main clock buffering unit outputs the differential clock signal pair, and
   generate each of the first and second clock signals from the single clock signal when the main clock buffering unit outputs the single clock signal.

6. The clock signal generating circuit of claim 1, further comprising:
   a repeater configured to buffer the output of the main clock buffering unit and transmit the buffered output to the sub clock buffering unit.

7. A semiconductor memory apparatus, comprising:
   a DLL circuit configured to receive an external clock signal and generate first and second delay clock signals;
   a frequency detector configured to detect the frequency of the external clock signal in order to generate a detection signal;
   a main clock buffering unit configured to receive the first and second delay clock signals for generating an internal clock signal, the main clock buffering unit being configured so as to be capable of generating a differential clock signal pair and a single clock signal and being configured to selectively output the differential clock signal pair or the single clock signal as the internal clock signal in response to the detection signal; and
   a sub clock buffering unit configured to generate first and second clock signals from the internal clock signal provided as the differential clock signal pair or the single clock signal in response to the detection signal.

8. The semiconductor memory apparatus of claim 7, wherein the frequency detector is configured to enable the detection signal when the frequency of the external clock signal is in a first frequency range and disable the detection signal when the frequency of the external clock signal is in a second frequency range.

9. The semiconductor memory apparatus of claim 8, wherein the first frequency range is a high-frequency region having a higher frequency than the second frequency range.

10. The semiconductor memory apparatus of claim 7, wherein the frequency detector is configured to detect the frequency of the external clock signal in response to a control signal.

11. The semiconductor memory apparatus of claim 10, wherein the frequency detector comprises:
    a detection pulse generating unit configured to receive the control signal in order to generate a detection pulse signal having a predetermined pulse width in which the detection pulse signal is enabled; and
    a detection signal generating unit configured to make a determine if a rising edge of the external clock signal is generated during an interval in which the detection pulse signal is enabled and configured to enable the detection signal according to the determination.

12. The semiconductor memory apparatus of claim 8, wherein the main clock buffering unit is configured to:
    output the differential clock pair as the internal clock signal when the detection signal is enabled, and
    output the single clock signal as the internal clock signal when the detection signal is disabled.

13. The semiconductor memory apparatus of claim 7, wherein the main clock buffering unit comprises:
    a first internal clock signal generating unit configured to receive the first delay clock signal and an external voltage to generate a first internal clock signal of the internal clock signal; and a second internal clock signal generating unit configured to receive the second delay clock signal and the detection signal, and generating a second internal clock signal of the internal clock signal only when the detection signal is enabled.

14. The semiconductor memory apparatus of claim 7, wherein the sub clock buffering unit is configured to:

generate the first and second clock signals from the differential clock signal pair when the detection signal is enabled, and generate the first and second clock signals from the single clock signal when the detection signal is disabled.

15. The semiconductor memory apparatus of claim 7, further comprising:

a repeater configured to buffer the internal clock signal.

* * * * *